United States Patent [19]

Gerard

[11] Patent Number: 4,480,235

[45] Date of Patent: Oct. 30, 1984

[54] COAXIAL MAGNETRON WITH IMPROVED STARTING

[75] Inventor: William A. Gerard, Andover, Mass.

[73] Assignee: Varian Associates, Inc., Palo Alto, Calif.

[21] Appl. No.: 459,013

[22] Filed: Jan. 18, 1983

[51] Int. Cl.³ .......................... H01J 25/50; H03B 9/10

[52] U.S. Cl. .................................... 331/91; 315/39.51; 315/39.67

[58] Field of Search .................. 331/86, 91; 315/39.51, 315/39.67

[56] References Cited

U.S. PATENT DOCUMENTS

| | | | |
|---|---|---|---|
| 3,636,403 | 1/1972 | Edwards et al. | 331/91 X |
| 4,053,850 | 10/1977 | Farney et al. | 331/91 |
| 4,194,142 | 3/1980 | Gerard | 315/39.51 X |

*Primary Examiner*—Siegfried H. Grimm
*Attorney, Agent, or Firm*—Stanley Z. Cole; William R. McClellan

[57] ABSTRACT

The cathode of a coaxial magnetron has a cylindrical electron emitter with a radially extending projection which is asymmetrical with respect to the axis of the emitter. The projection suppresses starting of the magnetron in the $TE_{121}$ mode and reduces starting jitter. In a preferred embodiment, the projection is in the form of a circumferential ridge extending around approximately one-half the circumference of the cylindrical surface and is centrally located thereon. The projection is oriented at 45 degrees with respect to the output of the magnetron. The power output of the magnetron is not substantially reduced.

8 Claims, 4 Drawing Figures

COAXIAL MAGNETRON WITH IMPROVED STARTING

DESCRIPTION

Background of the Invention

This invention relates to crossed field electron discharge oscillators with enhanced starting characteristics and, more particularly, to cathode structures which provide enhanced starting characteristics in coaxial magnetrons.

Magnetron oscillators are widely used in high power radar systems to generate microwave pulses. High voltage pulses applied to the cathode of the magnetron energize the tube and cause oscillation. The magnetron should begin oscillation at the desired output voltage and frequency with minimum delay upon application of a high voltage pulse. This is particularly important when the output pulse is very short in duration, for example, 0.1 microsecond.

Heretofore, problems have been experienced in the starting of coaxial magnetrons. Upon application of voltage, the magnetron can oscillate in the unwanted $TE_{121}$ mode, thereby delaying starting of the desired $TE_{011}$ mode. Various techniques have been successfully employed to inhibit unwanted modes after starting. However, the transient response during starting has remained a problem.

Various techniques have been employed to suppress starting of the $TE_{121}$ mode. The cathode has been positioned slightly off the axis of the tube, thereby reducing the dimension of the interaction space in one direction. Starting performance has been improved, but the output power of the magnetron is significantly reduced. The cathode has also been increased in diameter. However, the larger cathode requires large increases in magnetic field to maintain the same operating voltage. Symmetrical rings have been added around the cathode but have generally proved ineffective with respect to starting performance.

It is a general object of the present invention to provide novel crossed field electron discharge oscillators.

It is another object of the present invention to provide crossed field electron discharge oscillators with enhanced pulse starting performance.

It is yet another object of the present invention to provide crossed field electron discharge oscillators having enhanced starting in a desired mode without substantially reducing the power output of the oscillator.

It is still another object of the present invention to provide crossed field electron discharge oscillators wherein oscillation in undesired modes during starting is suppressed.

SUMMARY OF THE INVENTION

According to the present invention, these and other objects and advantages are achieved in a crossed field electron discharge oscillator comprising cathode means for generating a stream of electrons, a vacuum envelope for maintaining a vacuum about the stream, microwave circuit means for supporting electromagnetic fields in interactive relationship with the stream of electrons, and means for coupling electromagnetic wave energy from the circuit means. The device further includes means for applying an electric field between the cathode means and the circuit means and means for applying a magnetic field perpendicular to the electric field in the region of the stream of electrons. The cathode means includes an electron emitter with a generally cylindrical surface having at least one radially extending projection which is asymmetrical with respect to the axis of the cylindrical surface. The projection is operative to enhance starting of the device in a desired mode without substantially reducing the power output of the device. In a preferred embodiment, the projection is in the form of a circumferential ridge extending around less than the full circumference of the cylindrical surface of the electron emitter.

BRIEF DESCRIPTION OF THE DRAWINGS

For a better understanding of the present invention, together with other and further and objects, advantages and capabilities thereof, reference may be had to the accompanying drawings which are incorporated herein by reference and in which.

DETAILED DESCRIPTION OF THE INVENTION

Figure 1:
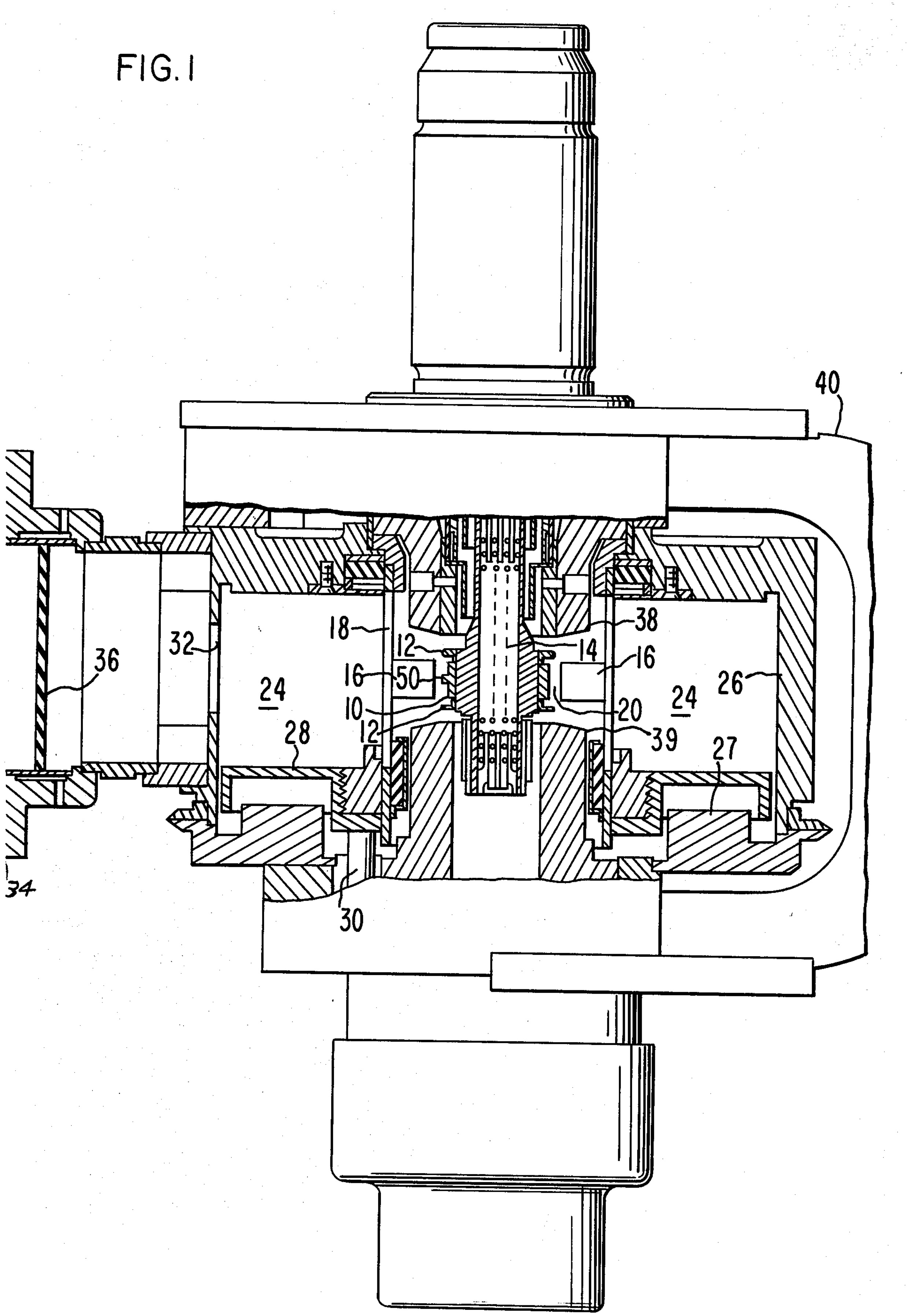
FIG. 1 is a partial cross-sectional view of a magnetron oscillator in accordance with the present invention.

A cross-sectional view of a coaxial magnetron in accordance with the present invention is shown in FIG. 1. The magnetron has a cathode electron emitter 10, such as tungsten impregnated with barium aluminate, with a generally cylindrical surface. At each end of emitter 10 is a projecting cathode end hat 12 of non-emitting material such as hafnium. The cathode is supported at one end on a cathode stem structure. The electron emitter 10 is heated by a radiant heater 14 such as a coil of tungsten wire.

Surrounding emitter 10 is a coaxial circular array of anode vanes 16 extending inward from an anode shell 18. The inner ends of the vanes 16 lie on a cylinder defining the outer wall of a toroidal interaction space 20. The vanes 16 are regularly spaced circumferentially to define between adjacent vanes cavities resonant at approximately the desired frequency of oscillation.

On the outside wall of alternate cavities, axial slots are cut through the anode shell 18 connecting with a toroidal stabilizing cavity 24. The cavity 24 includes walls 26, 27 which are preferably of copper to conductively cool the anode vanes 16 and to provide a high Q factor for frequency stabilization. The cavity 24 is tuned by an annular tuning plunger 28 which is axially movable by a plurality of pushrods 30 driven in unison by a tuning assembly. The cavity 24 is coupled by an iris 32 to an output waveguide 34 which is sealed off vacuum tight by a dielectric window 36.

Axially displaced on opposite sides of emitter 10 and anode vanes 16 are coaxial ferromagnetic polepieces 38, 39. The polepieces 38, 39 are sealed to the tube body and are coupled to a permanent magnet 40. The permanent magnet 40 and the polepieces 38, 39 are configured to present opposite poles to opposite ends of the interaction space 20, and a generally uniform, generally axial magnetic field is produced in the interaction space 20.

In operation of the magnetron shown in FIG. 1, ac heater current is supplied to the cathode heater 14, and the cathode is pulsed negative with respect to the grounded tube body and the anode vanes 16. Electrons are drawn from the cathode emitter 10 toward the vanes 16 and are directed by the crossed magnetic field into paths circulating around the toroidal interaction space 20 where they interact with fringing microwave electric fields of the inter-vane cavities and generate microwave energy. Microwave energy is coupled from the inter-vane cavities through the axial slots to the stabilizing cavity 24. The circular electric mode of the cavity 24 locks the frequency of the $\pi$ mode of the excited anode vanes 16 to the resonant frequency of the cavity 24. Thus, when the resonant frequency of the stabilizing cavity 24 is altered by movement of the tuning plunger 28, the frequency of operation of the magnetron is likewise altered.

Figure 2:
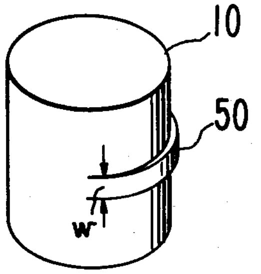
FIG. 2 is a perspective view of a cathode having a circumferential ridge to enhance magnetron starting in accordance with the present invention.
Figure 3:
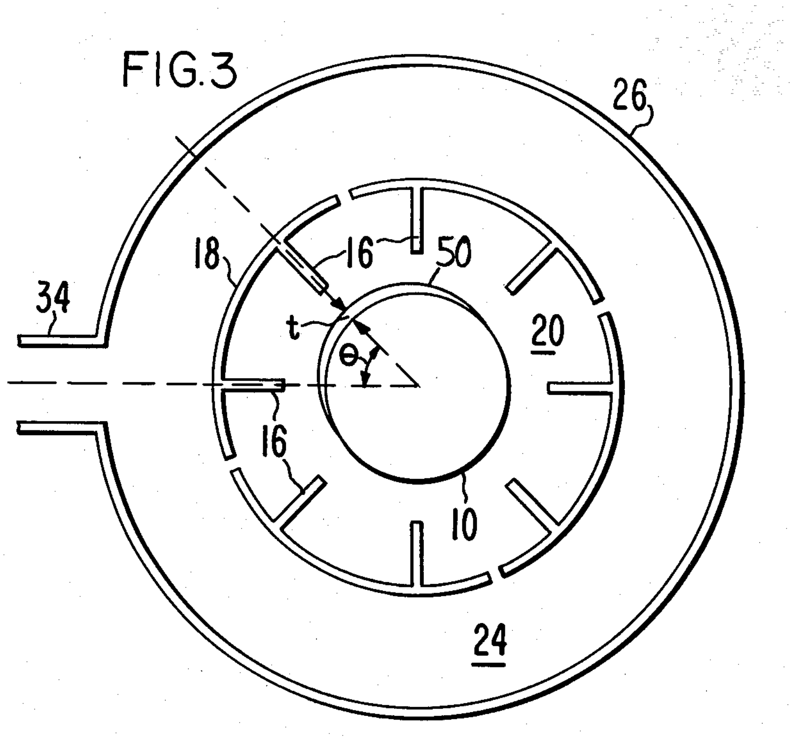
FIG. 3 is a schematic cross-sectional diagram of a magnetron oscillator in accordance with the present invention.

As shown in FIGS. 1–3, the electron emitter 10 has a generally cylindrical outer surface which is coaxial with the main axis of the magnetron. According to the present invention, the electron emitter 10 is provided with at least one radially extending projection 50 which is asymmetrical with respect to the axis of the cylindrical surface. Preferably, the projection 50 has a surface area which is small in comparison with the surface area of the cylindrical surface of the electron emitter 10. The purpose of the projection 50 is to enhance the starting of the magnetron in a desired mode without substantially reducing its power output. These requirements are met by a projection which is asymmetrical and which is small in comparison with the electron emitter.

In a preferred embodiment, the projection 50 is in the form of a circumferential ridge on the cylindrical surface of the electron emitter 10. The ridge extends around approximately one-half the circumference of the cylindrical surface and is centrally located thereon. The ridge can be tapered to zero thickness at both ends. It is preferred that the projection 50 have a surface area of less than 20% of the surface area of the cylindrical surface of the electron emitter 10. It is further preferred that the projection 50 extend radially into the toroidal interaction space 20 by about 10%–20% of the radial dimension of the interaction space 20. In one specific example of a C band magnetron, the electron emitter 10 has a diameter of 0.884 in. and a length of 0.310 in. The projection 50 is 0.030 in. in width w (see FIG. 2) and 0.020 in. in thickness t (see FIG. 3). The projection 50 is preferably oriented at an angle $\theta$ of 45° with respect to the output waveguide 34 (see FIG. 3).

In other embodiments, the electron emitter 10 can include more than one radially extending projection. Furthermore, the projection can be located axially on the cylindrical surface of the electron emitter 10 at any point along its length. The projection can also have the form of an axial ridge on the cylindrical surface rather than a circumferential ridge.

The cavity of the coaxial magnetron operates in the $TE_{011}$ mode. In this mode, the electric field is present only in a continuous ring. This mode couples into the anode via alternate slots in the anode shell 18 forming a $\pi$ mode field in the anode. Experience has shown that the $TE_{121}$ is the cavity mode presenting the greatest competition in oscillation starting. It has been theorized that in an oscillator with two or more degrees of freedom each possible oscillation starts. This means that in the electron hub in the magnetron, electrons begin to move in synchronism with the $TE_{011}$ mode, others in synch with the $TE_{121}$ mode, and yet others in synch with other possible modes of operation. When one oscillation reaches the nonlinear condition; that is, one where strong well-defined, electron-filled spokes are formed, the phase focusing forces destroy the weaker spokes associated with all other modes leaving one mode dominant.

Figure 4:
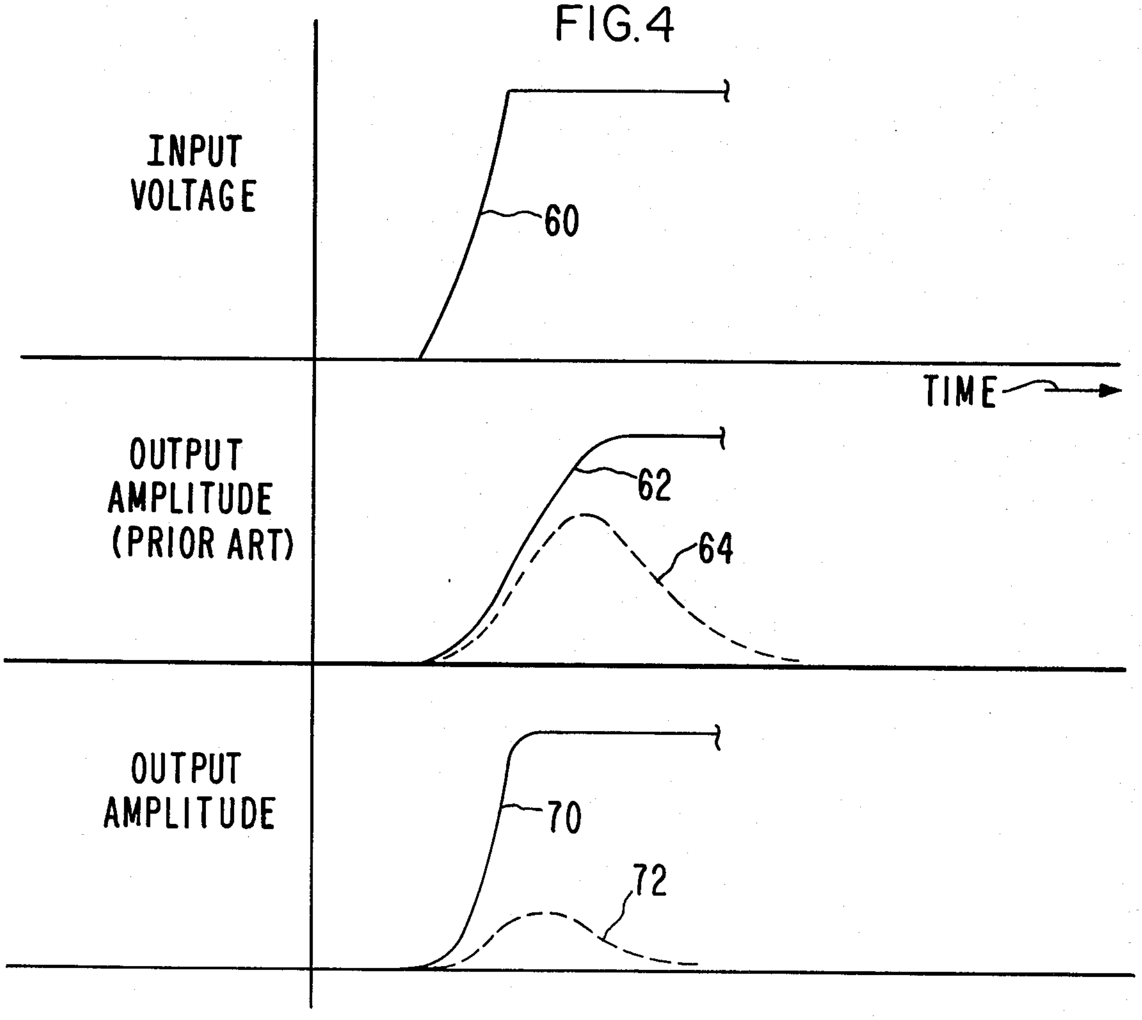
FIG. 4 graphically illustrates the starting performance of a magnetron in accordance with the present invention as compared with prior art magnetrons.

During the starting period, the $TE_{121}$ mode can oscillate strongly. This phenomenon is illustrated graphically in FIG. 4. The magnetron input voltage is represented by the curve 60. The $TE_{011}$ mode amplitude in prior art magnetrons is illustrated by the curve 62, while the $TE_{121}$ mode amplitude is illustrated by the curve 64. The relative amplitudes of the $TE_{011}$ and $TE_{121}$ modes are exaggerated in FIG. 4 for illustrative purposes. In reality, a $TE_{121}$ mode amplitude 30 db below the $TE_{011}$ mode amplitude is common in prior art magnetrons and can be unacceptable for certain applications. A difference of 50–60 db is frequently required. As indicated by the curve 64, the $TE_{121}$ mode amplitude is substantial during starting. When the projection described hereinabove is added to the electron emitter, the $TE_{011}$ mode reaches full amplitude in a shorter time as indicated by the curve 70 in FIG. 4. Furthermore, the $TE_{121}$ mode is reduced in amplitude, as indicated by the curve 72. Since the projection is small in comparison with the electron emitter, the effect on the output power of the magnetron is insignificant. The projection on the electron emitter is believed to be effective in suppressing the $TE_{121}$ mode due to the angular dependence of the electric field in the $TE_{121}$ mode. The $TE_{011}$ mode, by contrast, does not vary with angle around the cavity and is not substantially affected by the projection.

While there has been shown and described what is at present considered the preferred embodiments of the invention, it will be obvious to those skilled in the art that various changes and modifications may be made therein without departing from the scope of the invention as defined by the appended claims.

What is claimed is:

1. A crossed field electron discharge oscillator comprising:

cathode means for generating a stream of electrons, including an electron emitter with a generally cylindrical surface having at least one radially extending projection which is asymmetrical with respect to the axis of said cylindrical surface;

a vacuum envelope for maintaining a vacuum about said stream;

microwave circuit means for supporting electromagnetic fields in interactive relationship with said stream of electrons;

means for coupling electromagnetic wave energy from said circuit means;

means for applying an electric field between said cathode means and said circuit means; and means for applying a magnetic field perpendicular to said electric field in the region of said stream, said projection on said electron emitter being operative to enhance starting of said oscillator in a desired mode without substantially reducing the power output of said oscillator.

2. The oscillator as defined in claim 1 wherein said projection is in the form of a circumferential ridge on said cylindrical surface.

3. The oscillator as defined in claim 1 wherein the surface area of said projection is less than 20% of the surface area of said cylindrical surface.

4. The oscillator as defined in claim 2 wherein said ridge extends around less than the full circumference of said cylindrical surface and is tapered to zero thickness at its ends.

5. The oscillator as defined in claim 4 wherein said cathode means and said circuit means define therebetween a toroidal interaction space and wherein said projection extends radially into said interaction space by about 10 to 20 percent of the radial dimension of said interaction space.

6. The oscillator as defined in claim 4 wherein said means for coupling electromagnetic energy from said circuit means includes stabilizing cavity means coupled to said electromagnetic fields of said circuit means and an output coupling iris for coupling electromagnetic fields from said cavity means and wherein said projection is oriented at an angle of about 45 degrees with respect to said iris.

7. The oscillator as defined in claim 6 wherein said ridge is axially centered on said cylindrical surface.

8. The oscillator as defined in claim 1 wherein said projection on said electron emitter is adapted to suppress starting of said oscillator in a $TE_{121}$ mode.

* * * * *